United States Patent
Xi et al.

(10) Patent No.: US 10,061,704 B2
(45) Date of Patent: *Aug. 28, 2018

(54) SYSTEMS AND METHODS FOR MANAGING CACHE OF A DATA STORAGE DEVICE

(71) Applicant: Marvell International LTD., Hamilton (BM)

(72) Inventors: Weiya Xi, Singapore (SG); Chao Jin, Singapore (SG); Khai Leong Yong, Singapore (SG); Sophia Tan, Singapore (SG); Zhi Yong Ching, Singapore (SG)

(73) Assignee: Marvell International LTD., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 15/363,325

(22) Filed: Nov. 29, 2016

(65) Prior Publication Data

US 2017/0075809 A1 Mar. 16, 2017

Related U.S. Application Data

(63) Continuation of application No. 15/048,065, filed on Feb. 19, 2016, now Pat. No. 9,524,238, which is a
(Continued)

(30) Foreign Application Priority Data

Feb. 23, 2012 (SG) .................................. 201201288

(51) Int. Cl.
*G06F 12/00* (2006.01)
*G06F 12/0868* (2016.01)
(Continued)

(52) U.S. Cl.
CPC ........ *G06F 12/0868* (2013.01); *G06F 3/0607* (2013.01); *G06F 3/0665* (2013.01); *G06F 3/0685* (2013.01); *G06F 12/0246* (2013.01); *G06F 12/0802* (2013.01); *G06F 12/0866* (2013.01); *G06F 12/0871* (2013.01); *G06F 12/0873* (2013.01); *G06F 12/0891* (2013.01); *G06F 17/30324* (2013.01); *G11C 7/1072* (2013.01); *G06F 2212/205* (2013.01); *G06F 2212/222* (2013.01); *G06F 2212/31* (2013.01); *G06F 2212/313* (2013.01); *G06F 2212/466* (2013.01); *G06F 2212/6042* (2013.01);
(Continued)

(58) Field of Classification Search
CPC ............. G06F 12/0246; G06F 12/0866; G06F 12/0871; G06F 12/0873; G06F 2212/31; G06F 12/313; G06F 12/7207; G06F 12/7209

See application file for complete search history.

(56) References Cited

U.S. PATENT DOCUMENTS

2013/0086330 A1* 4/2013 Baddepudi .......... G06F 12/0868
711/143

* cited by examiner

*Primary Examiner* — Shawn X Gu

(57) ABSTRACT

A data storage device includes a data storage medium having a plurality of data blocks. A cache includes a plurality of cache blocks. Each cache block includes a corresponding cache block address. A metadata table includes a plurality of table entries for the data blocks, respectively. Each of the table entries is configured to store the cache block address of one of the cache blocks in which data of a corresponding one of the data blocks is written. A bitmap is configured to store statuses of all of the cache blocks, respectively.

20 Claims, 12 Drawing Sheets

| | Cache Block Address (21 bits for 8GB) | Status (2 bits) | Padding (1 bit) |
|---|---|---|---|
| LBA 0 | CBA i | clean | |
| | ...... | | |
| | | dirty | |
| | ...... | | |
| LAB max 2²⁸ | CBA j | free | |

500

Related U.S. Application Data continuation of application No. 13/773,942, filed on Feb. 22, 2013, now Pat. No. 9,268,705.

(51) Int. Cl.
*G06F 12/0891* (2016.01)
*G06F 12/02* (2006.01)
*G06F 12/0873* (2016.01)
*G06F 12/0866* (2016.01)
*G06F 12/0871* (2016.01)
*G06F 12/0802* (2016.01)
*G06F 3/06* (2006.01)
*G06F 17/30* (2006.01)
*G11C 7/10* (2006.01)

(52) U.S. Cl.
CPC ............. *G06F 2212/7207* (2013.01); *G06F 2212/7209* (2013.01); *Y02D 10/13* (2018.01)

SYSTEMS AND METHODS FOR MANAGING CACHE OF A DATA STORAGE DEVICE

CROSS-REFERENCE TO RELATED APPLICATION

This application is a continuation of U.S. patent application Ser. No. 15/048,065, filed Feb. 19, 2016, which is a continuation of U.S. patent application Ser. No. 13/773,942 (now U.S. Pat. No. 9,268,705), filed Feb. 22, 2013, which claims the benefit of priority of Singapore Patent Application No. 201201288-6, filed Feb. 23, 2012. The entire disclosures of the applications referenced above are incorporated herein by reference.

TECHNICAL FIELD

Various embodiments relate generally to a data storage device and a method of managing a cache in a data storage device.

BACKGROUND

A conventional hard disk drive is equipped with several rotational disk platters and a small amount of dynamic random access memory (DRAM). The disk platters are magnetic media to store data, and the DRAM is used as a data buffer between the disk platters and a host operating system.

FIG. 1 shows a schematic diagram of a hybrid disk 100 coupled to a host operating system 101. The hybrid disk has a disk media 102, a DRAM 104, a non-volatile (NV) cache 106 and a disk controller 108. The NV cache 106 may be a non-volatile (NV) memory, such as a flash chip. The major difference between a conventional hard disk and a hybrid disk 100 is that, a hybrid disk integrates a non-volatile (NV) memory, such as a flash chip, into the disk drive. The disk media 102 usually has high capacity but low speed, while the NV cache 106 has low capacity but high speed. The NV cache 106 is used as a read/write cache to accelerate the data accesses on the disk 100.

To manage the NV cache 106, the hybrid disk 100 needs to set up metadata (index) structure inside the disk drive. To ensure performance, the cache metadata needs to be queried and updated very efficiently. One portion of the DRAM 104 inside the hybrid disk 100 is reserved to store the cache metadata 110. However, the size of the DRAM 104 is quite small, and most of it must be used as the disk buffer 112. Thus, the cache metadata size inside the DRAM 104 is limited. In addition, the more data in the DRAM 104, the more power the DRAM 104 consumes.

The disk media 104 may have a plurality of data blocks. Each data block on the disk media 104 can have a single sector or multiple consecutive sectors. If the data block has a single sector, the data block is represented by its Logical Block Address (LBA). If the data block has multiple consecutive sectors, the data block is represented by the LBA of the first sector.

The NV cache 106 may have a plurality of cache blocks. Each cache block in the NV cache 106 can be defined with the same block size as the one on the disk media $104_{25}$ and is represented by its Cache Block Address (CBA). The cache metadata maintains the mapping between a LBA and a CBA (indicating that the LBA data block is cached in the CBA cache block), and also the status (e.g., CLEAN, DIRTY, or FREE) of each cache block. The status of each cache block may contain only one description for the whole block or each sector within the cache block may have its individual description.

A conventional cache management scheme uses the set associative hash table to store the cache metadata. The entire NV cache CBA space is divided into N sets, and each set has a plurality of blocks as shown in FIG. 2. Each LBA in the disk media is hashed into one of the sets of the NV cache using a hash function:

target set=(LBA/block size/set size)mod(number of sets).

Within one set (e.g. set i of FIG. 2), the LBAs are stored linearly from the first entry (e.g. Block 0 of FIG. 2) to the last entry (e.g. Block 511 of FIG. 2) of the set. Therefore, to query if any LBA exists in the hash table, it needs to first compute the corresponding hash set for the LBA, and then and then search linearly from the beginning to the end of the set to check if the LBA exists in the set.

Similarly, to store a LBA into the hash table, it needs to first compute the corresponding hash set for the LBA, and then search linearly within the set to find a free entry to store the LBA into it. The metadata search and update of the conventional cache management scheme is inefficient.

For a hybrid disk drive 100, the disk media size may be about 1 TB, the DRAM size may be about 16 MB, and the NV cache size may be about 8 GB. If the data block size is about 4 KB, the NV cache will have a total number of 8 GB/4 KB=$2^{21}$ cache blocks (CBAs). In the ATA standard, each disk block LBA is represented by 6 bytes. Thus, for each cache block (CBA), the corresponding entry in the hash set is represented by 6 bytes for the LBA and 2 bits for the status of the cache block. FIG. 3 illustrates the metadata table 300 of the NV cache under the conventional set associative hash scheme. As a result, the total size of the in-DRAM hash table 300 is about 12.5 MB, which is large as compared to the DRAM size of about 16 MB. Therefore, the conventional cache management scheme is impractical for the hybrid disks.

SUMMARY

According to one embodiment, a data storage device is provided. The data storage device includes a data storage medium having a plurality of data blocks, a cache having a plurality of cache blocks, wherein each cache block is identified by a cache block address, a cache control memory including a memory element for each data 15 block configured to store the cache block address of the cache block in which data of the data block is written.

According to one embodiment, a method of managing a cache in a data storage device, the data storage device comprising a data storage medium having a plurality of data blocks, the cache having a plurality of cache blocks and each cache block being identified by a cache block address is provided. The method includes storing for each data block, the cache block address of the cache block in which data of the data block is written.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Embodiments of a data storage device and a method of 10 managing a cache in a data storage device will be described in detail below with reference to the accompanying figures. It will be appreciated that the embodiments described below can be modified in various aspects without changing the essence of the invention.

Figure 4:
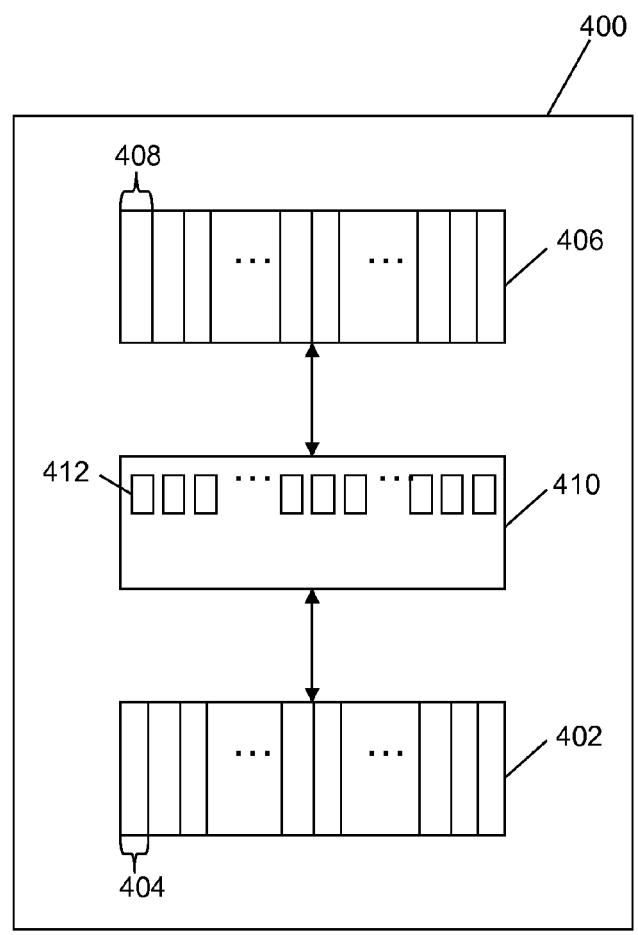
FIG. 4 shows a schematic diagram of a data storage device according to one embodiment.

FIG. 4 shows a schematic diagram of a data storage device 400. The data storage device 400 includes a data storage medium 402 having a plurality of data blocks 404. The data storage device 400 includes a cache 406 having a plurality of cache blocks 408. Each cache block 408 is identified by a cache block address (CBA). The data storage device 400 includes a cache control memory 410. The cache control memory 410 includes a memory element 412 for each data block 404. The memory element 412 for each data block 404 is configured to store the cache block address of the cache block 408 in which data of the data block 404 is written.

In one embodiment, the data storage device 400 may be a hybrid disk. The cache 406 may be a non-volatile (NV) cache. The cache 406 may be a non-volatile memory, such as a flash chip.

In one embodiment, each data block 404 may be identified by a block address (may also be referred as 5 "logical block address (LBA)"). The block addresses of the plurality of data blocks 404 may be LBA0, LBA1, . . . , LBAm, where m is the total number of data blocks 404. In context of various embodiments, the term "block address" and the term "LBA" may be used interchangeably.

In one embodiment, the cache block addresses of the plurality of cache blocks 408 may be CBA0, CBA1, . . . , CBAn, where n is the number of cache blocks 408.

Figure 1:
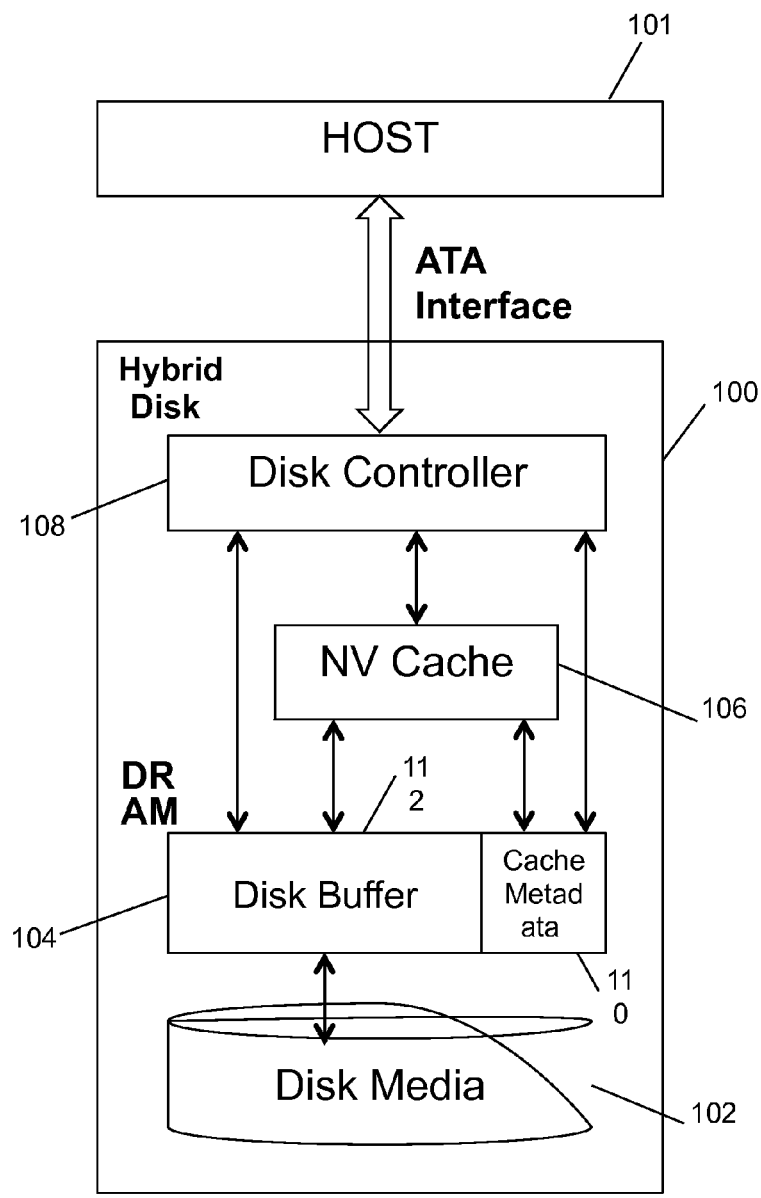
FIG. 1 shows a schematic diagram of a hybrid disk coupled to a host operating system.
Figure 2:
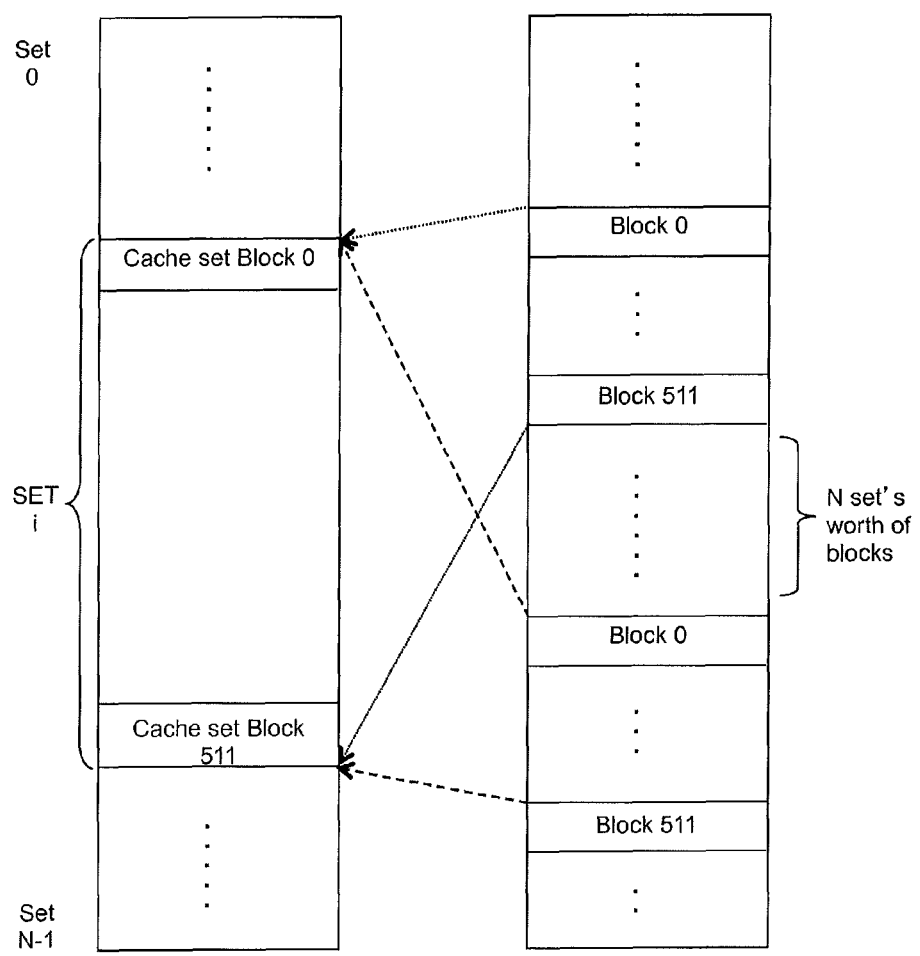
FIG. 2 shows a cache space arrangement for a conventional cache management scheme.
Figure 3:
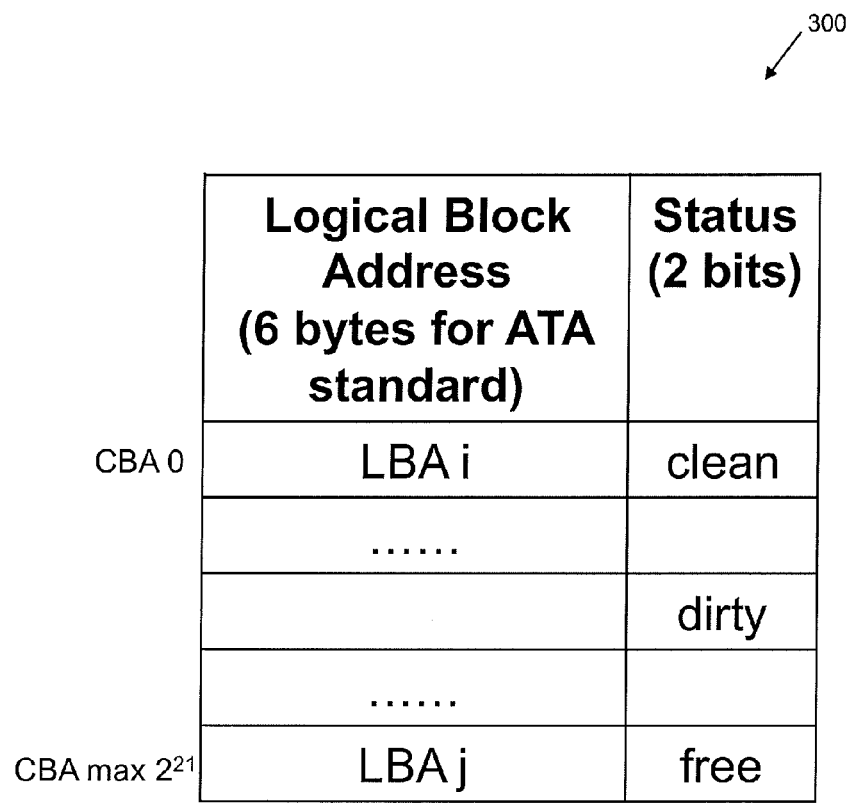
FIG. 3 shows a metadata table of a cache for a conventional set associative hash scheme.

The memory element 412 for each data block 404 is further configured to store the status of the cache block 408 in which data of the data block 404 is written. The status of the cache block 408 may be "clean", "dirty" or "free". The status "clean" means that the data in the cache block 408 is the same as the data of the data block 404 (i.e. the data in the cache block 408 is up to date). The status "dirty" means that the data in the cache block 408 has been modified by a host operating system (e.g. the host operating system 101 of FIG. 1) and has not been written to the data storage medium 402, and thus the data in the cache block 408 is inconsistent with the data in the data block 404. The status "free" means that the cache block 408 is available/free to be used for writing data of a data block 404.

The memory element 412 for each data block 404 is further configured to store the cache block address and the status of the cache block 408 in the cache 406. The cache block address and the status of the cache block 408 in a reserved area of the cache 406.

For each data block 404 having data written in the cache block 408, the cache block address and the status of the cache block 408 may be stored as an entry in a metadata table. For example, the cache block address and the status of the cache block 408 may be stored as an entry in a row of the metadata table.

Figure 5:
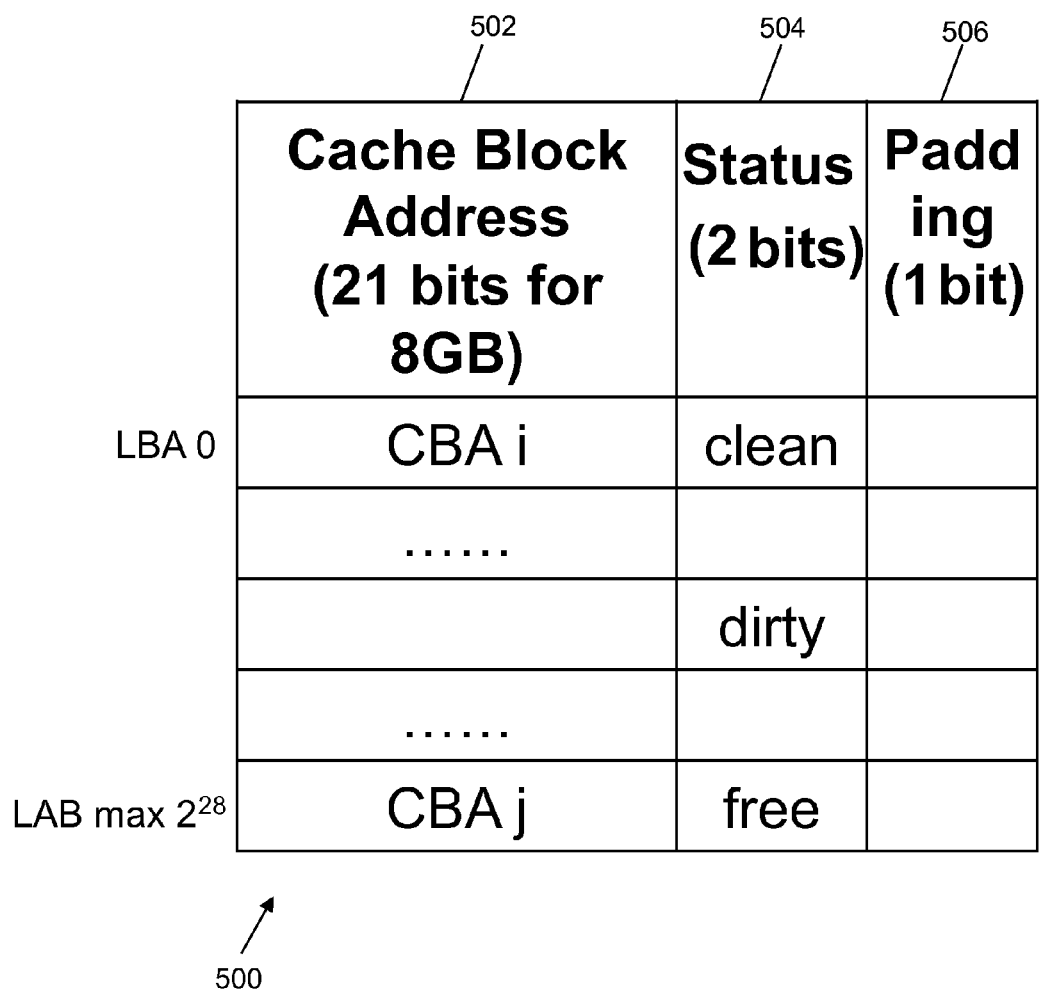
FIG. 5 shows a metadata table for a data storage device according to one embodiment.

FIG. 5 shows an exemplary metadata table 500. Column 502 of the metadata table 500 lists the cache block addresses of the cache blocks 408 in which data of the data blocks are written. Column 504 of the metadata table 500 lists the status of the cache blocks 408. Column 506 of the metadata table 500 lists the bit padding.

The entry in each row of the metadata table 500 corresponds to a data block 404 (e.g. a block address of a data block 404). A one-to-one mapping may be set up between the data blocks (e.g. LBAs) and the table entries.

The table entries, including the cache block 20 addresses and the status of the cache blocks 408 and the bit padding, may be arranged in a predetermined order. In one embodiment, the first table entry (e.g. first row of the metadata table 500) may correspond to the first data block (e.g. LBA0), the second table entry (e.g. second row of the metadata table 500) may correspond to the second data block (e.g. LBA1), and so on. Each table entry stores the corresponding CBA (indicating that the LBA data block is cached in the CBA cache block), and the status of the cache block.

In another embodiment, the first table entry (e.g. first row of the metadata table 500) may correspond to the last data block (e.g. LBAm), the second table entry (e.g. second row of the metadata table 500) may correspond to the second last data block (e.g. LBA(m−1)), and so on.

In other embodiments, the table entries may be arranged in different orders/sequences.

Figure 6:
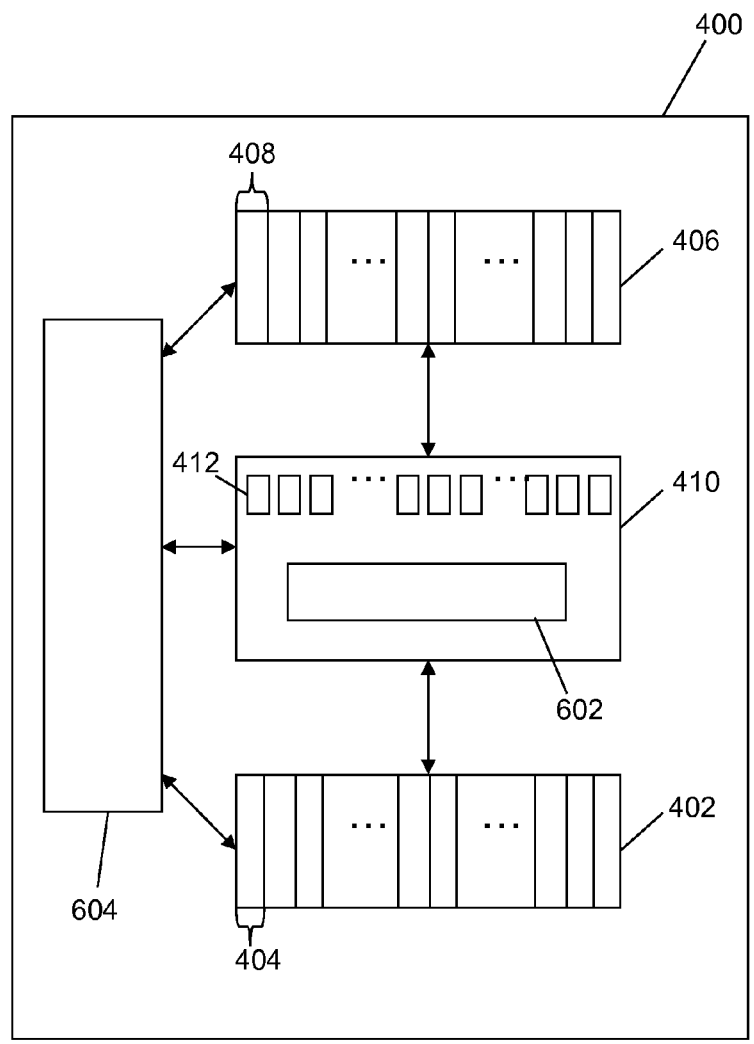
FIG. 6 shows a schematic diagram of a data storage device according to one embodiment.

In one embodiment, as shown in FIG. 6, the data storage device 400 may further include a further memory element 602. The further memory element 602 is configured to store the status of the plurality of cache blocks 408. The further memory element 602 is configured to store the status of the plurality of cache blocks 408 in a memory cell 604 or in the cache 406. The memory cell 604 may include but is not limited to dynamic random access memory (DRAM).

Figure 7:
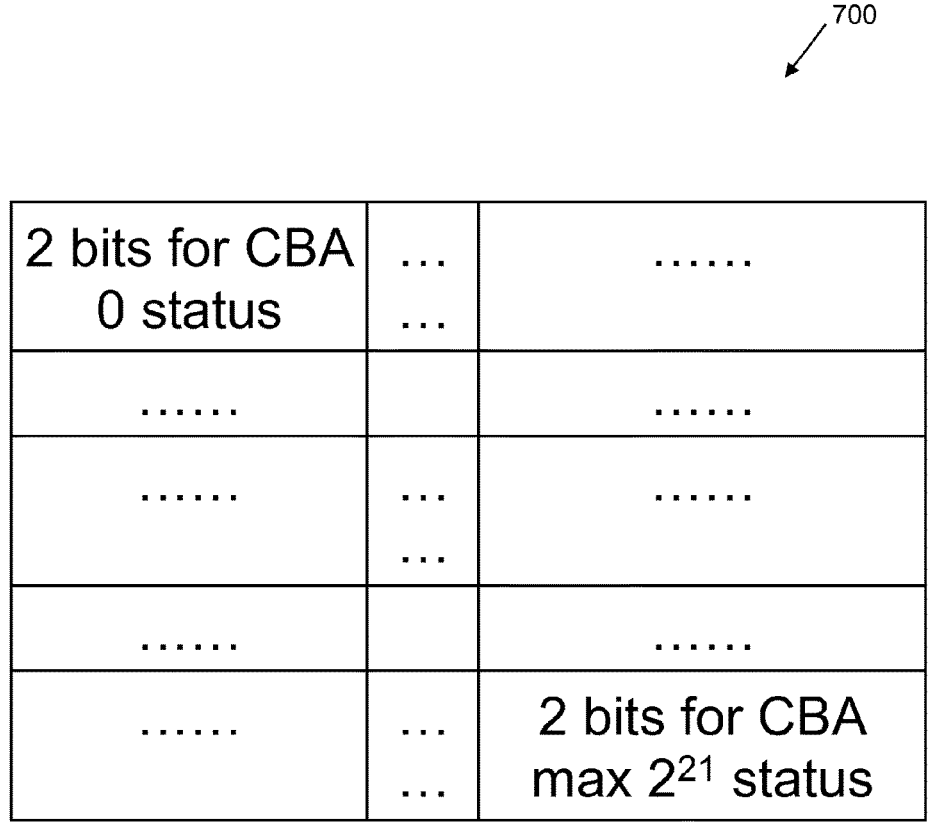
FIG. 7 shows a bitmap for a data storage device according to one embodiment.

The status of all the cache blocks 408 may be stored in a bitmap 700 as shown in FIG. 7. The bitmap 700 may be stored in the memory cell 604. The bitmap 700 may be stored in the cache 406 together with the metadata table 500. The bitmap 700 can be used to quickly identify the status of the cache blocks 408.

The data storage device 400 can allow the table entry for each data block 404 (LBA) to be directly located in the metadata table 500, without any search or computation. To query if a particular LBA data block 400 is cached, the cache control memory 410 only needs to access the cache 406 once to read the corresponding table entry, and to check the status field. To store a LBA data block 404 into the cache 406, the cache control memory 410 may first search the bitmap 700 to locate a free cache block 408, and then store the CBA and the status of the cache block 408 in the corresponding table entry of the data block 404, and update the bitmap 700 at the same time.

Assuming that the data storage medium 402 has about 1 TB capacity and the data block size is about 4 KB, the total number of data blocks 404 (LBAs) is computed as 1 TB/4 KB=228. Assuming that the NV cache size is about 8 GB, there is a total number of (8 GB/4 KB)=221 cache blocks 408. Each cache block address (CBA) can be represented by 21 bits, as shown in the metadata table 500 of FIG. 5. Therefore, the corresponding table entry of each data block 404 is represented by 23 bits including 2 bits for the status of the cache block 408. In one embodiment, 2 bits are used to record block the status of the cache block 408, e.g. "clean", "dirty" and "free". The number of bits required depends on how many different statuses need to be recorded. For the alignment purpose, 3 bytes (i.e. 24 bits) are used to store each table entry in the cache 406. The total size of the cache 406 required to store the metadata table 500 is 768 MB.

Each cache block 408 uses 2 bits in the bitmap 700 to store its status. Similar to the metadata table entry status recording, 2 bits are used to record three different statuses, e.g. "free", "dirty" and "clean". The number of bits required is dependent on the number of statuses needed to be recorded. The total space required to store the bitmap 700 is 512 KB. The bitmap can be stored either in the DRAM or the NV cache. Hence, as compared to the conventional set associative hash scheme, the above described scheme requires smaller DRAM capacity.

In one embodiment, each data block 404 of the data storage medium 402 may have a single sector. If the data block 404 has a single sector, the data block 404 may be represented by its block address (e.g. Logical Block Address (LBA)). Each cache block 408 may also have a single sector.

In one embodiment, each data block 404 of the data storage medium 402 may have multiple consecutive sectors (e.g. a plurality of sectors). Each sector of the data block 404 may be identified by its own block address (e.g. Logical Block Address (LBA)). Thus, the data block 404 may be represented by the LBA of the first sector.

Each cache block 408 may have multiple consecutive sectors. The multiple consecutive sectors of a cache block 408 may correspond to the multiple consecutive sectors of a data block 404. If the cache block size and the data block size are the same, the multiple consecutive sectors of a cache block 408 may correspond to all the multiple consecutive sectors of the data block 404.

If the cache block size is larger than the data block size, the multiple consecutive sectors of a cache block 408 may correspond to multiple consecutive sectors of one or more data blocks 404. For example, the multiple consecutive sectors of a cache block 408 may correspond to all the multiple consecutive sectors of one data block 404 and some sectors of another data block 404. Depending on the cache block size, different configurations/embodiments are possible. A larger cache block size may result in fewer entries in the metadata table.

The status of the cache block 408 having multiple consecutive sectors may be recorded for the whole block or for each individual sector. If the status of the cache block 408 is recorded for the whole block, the status of all the sectors of the cache block 408 must be the same, e.g. kept consistent. A sector may not be cached or a read-modify-write procedure may be invoked to keep the status of all the sectors of the cache block 408 consistent.

In one embodiment, a partially occupied cache block 408 may be marked as "clean" or "dirty" in the bitmap 700. A cache block 408 with one or more dirty sectors may be indicated as "dirty" in the bitmap 700. A partially occupied cache block 408 can only be marked as either "clean" or "dirty" in the bitmap 700 depending on whether there is any "dirty" sector. If there is no "dirty" sector at all, the cache block 408 is "clean". If there are one or more than one "dirty" sectors, the cache block 408 should be marked as "dirty".

Some examples illustrating recording the status of the cache block 408 for the whole block or for each individual sector are described in the following.

In the first example, the data storage medium 402 may be about 1 TB and the cache 406 may be about 8 GB. The size of each data block 404 and each cache block 408 may be about 4 KB. Each cache block 408 may have 8 sectors and 2 bits may be used to record the status of each sector. There may be a total of (1 TB/4 KB)=228 data blocks 404 (e.g. entries in the metadata table 500). There may be a total of (8 GB/4 KB)=221 cache blocks 408. 3 bytes may be used to record the cache block address of each cache block 408. To store the status of all the 8 sectors of each cache block 408, (2×8)=16 bits (i.e. 2 bytes) may be used. Therefore, a total of 5 bytes may be used to record each table entry (i.e. the cache block address and the status of all the 8 sectors of each cache block 408) in the metadata table 500. The total size of the cache 406 required to store the metadata table 500 is (228×5 bytes)=1280 MB. Each cache block 408 may use 2 bits in the bitmap 700 to store its status. The total space required to store the bitmap 700 in the DRAM is (221×2 bits)=512 KB. A smaller DRAM capacity is required to store the bitmap 700 as compared to the conventional set associative hash scheme.

In the second example, the data storage medium 402 may be about 1 TB and the cache 406 may be about 8 GB. The size of each data block 404 and each cache block 408 may be 15 about 16 KB. Each cache block 408 may have 32 sectors and 2 bits may be used to record the status of each sector. There may be a total of (1 TB/16 KB)=226 data blocks 404 (e.g. entries in the metadata table 500). There may be a total of (8 GB/16 KB)=219 cache blocks 408. 3 bytes may be used to record the cache block address of each cache block 408. To store the status of all the 16 sectors of each cache block 408, (2×16)=64 bits (i.e. 8 bytes) may be used. Therefore, a total of 11 bytes may be used to record each table entry (i.e. the cache block address and the status of all the 16 sectors of each cache block 408) in the metadata table 500. The total size of the cache 406 required to store the metadata table 500 is (219×11 bytes)=704 MB. Each cache block 408 may use 2 bits in the bitmap 700 to store its status. The total space required to store the bitmap 700 in the DRAM is (219×2 bits)=128 KB.

There are fewer entries in the metadata table for the second example as compared to the first example because of the larger cache block size. A smaller DRAM capacity is required to store the bitmap 700 as compared to the conventional set associative hash scheme. A smaller DRAM capacity is required to store the bitmap 700 for the second example as compared to the first example.

In the third example, the data storage medium 402 may be about 1 TB and the cache 406 may be about 8 GB. The size of each data block 404 and each cache block 408 may be about 16 KB. Each cache block 408 may have 32 sectors and 2 bits may be used to record the status of each cache block 408. There may be a total of (1 TB/16 KB)=226 data blocks 404 (e.g. entries in the metadata table 500). There may be a total of (8 GB/16 KB)=219 cache blocks 408. 19 bits may be used to record the cache block address of each cache block 408. Therefore, a total of 3 bytes may be used to record each table entry (i.e. the cache block address and the status of each cache block 408) in the metadata table 500. The total size of the cache 406 required to store the metadata table 500 is (219×3 bytes)=192 MB. Each cache block 408 may use 2 bits in the bitmap 700 to store its status. The total space required to store the bitmap 700 in the DRAM is (219×2 bits)=128 KB.

A smaller cache capacity is required to store the metadata table 500 for the third example as compared to both the first and second examples. A smaller DRAM capacity is required to store the bitmap 700 as compared to the conventional set associative hash scheme. A smaller DRAM capacity to store the bitmap 700 is required for the third example as compared to the first example.

Other possible functions of the cache 406 and the cache control memory 410 are described in the following.

In one embodiment, the ATA-8 standard commands for managing the cache 406 include but are not limited to "ADD LBAs to NV Cache Pinned Set", "REMOVE LBAs from NV Cache Pinned Set", "QUERY NV Cache Pinned Set", "QUERY NV Cache Misses", "FLUSH NV Cache", and "NV Cache Enable/Disable". "ADD LBAs to NV Cache Pinned Set" means add the LBA (Logical Block Address) of a data block 404 (not the data of a data block) to the NV Cache Pinned Set. This indicates that the data of the data block 404 will be cached in the cache block 408. "NV Cache Pinned Set" refers to the set of LBA(s) that have been made un-removable from the NV Cache by a host operating system. "REMOVE LBAs from NV Cache Pinned Set" means remove the LBA of a data block 404 from the NV Cache Pinned Set, and this indicate that the data of the data block 404 will no longer be cached in the cache block 408. "QUERY NV Cache Pinned Set" means query which LBAs are currently in the NV Cache Pinned Set. "QUERY NV Cache Misses" reports cache miss data in LBA ranges. "FLUSH NV Cache" means write the dirty data in the NV Cache to the disks. "NV Cache Enable/Disable" is to enable or disable the cache 406. There are other standards to allow a host operating system to manage the cache 406. Some of the standards have been finalized such as ATA-8 and some of the standards are still at the stage of drafting.

The metadata table 500 may be used to check if a particular LBA is cached, to check the cache block in which a cached LBA is stored, to check the status of each cache block 408, and to check the number of free cache blocks 408 in the cache 406.

In one embodiment, the cache control memory 410 may receive an "Add LBAs" command or other commands from a host operating system (e.g. host operating system 101 of FIG. 1) to instruct the disk drive 400 (also referred as data storage device) to add/cache data to the cache 406. The ADD command or other NV cache commands which are still in the stage of drafting is a command for a host operating system to instruct the data storage device 400 to cache data. In other words, the ADD command is a cache command for hybrid drives with embedded NV cache. The cache control memory 410 may be configured to write data of each data block 404 in a corresponding cache block 408. The cache control memory 410 may be configured to write data of each data block 404 individually (i.e. in data block size). The cache control memory 410 may be configured to add LBA of each data block 404 individually.

The cache control memory 410 may be configured to determine if a cache block 408 is allocated for the data block 404 before writing the data of the data block 404. The cache control memory 410 may be configured to write the data of the data block 404 in the allocated cache block 408 and update the status of the cache block 408 if it is determined that a cache block 408 is allocated for the data block 404. The LBA of the data block 404 may be added in the NV Cache Pinned Set. The data of the data block 404 may be cached in the cache 406. If it is determined that a cache block 408 is not allocated for the data block 404, the cache control memory 410 is configured to search for a free cache block 408, allocate the free cache block 408 to the data block 404, and determine if the allocation of the free cache block 408 to the data block 404 is successful.

The cache control memory 410 may be configured to write the data of the data block 404 in the allocated cache block 408 and to update the status of the cache block 408 if it is determined that the allocation of the free cache block 408 to the data block 404 is successful. The LBA of the data block 404 may be added in the NV Cache Pinned Set. The data of the data block 404 may be cached in the cache 406. If it is determined that the allocation of the free cache block 408 to the data block 404 is unsuccessful, the cache control memory 410 may be configured to remove some data in the cache 406, search for a free cache block 408, allocate the free cache block 408 to the data block 404, and determine if the allocation of the free cache block 408 to the data block 404 is successful.

In one embodiment, the cache control memory 410 may receive a "Remove LBAs" command or other similar commands from a host operating system (e.g. the host operating system 101 of FIG. 1) to remove data in the cache 406. The cache control memory 410 may be configured to remove data of each cache block 408 and update the status of each cache block 408 after the data is removed. The cache control memory 410 may be configured to remove data of each cache block 408 individually (i.e. in data block size) from the cache 406. The cache control memory 410 may be configured to remove the LBA of the data block 404 from the NV Cache Pinned Set. The data block 404 may no longer be cached in the cache 406.

In one embodiment, the cache control memory 410 may receive a "Write data" command. The Write command is a standard command for a host operating system to instruct a data storage device (e.g. data storage device 400) to write data on a disk LBA (e.g. data block 404). It is a standard command for all kinds of disk drives. The cache control memory 410 may be configured to write data of the data block 404 in the data storage medium 402 if it is determined that a cache block 408 is not allocated for the data block 404. The cache control memory 410 may be configured to write data of the data block 404 in the data storage medium 402 if no cache block 408 can be successfully allocated for the data block 404. In other words, the LBA of the data block 404 is not cached.

In one embodiment, the cache control memory 410 may receive a "Read data" command. The cache control memory 410 may be configured to read data of each data block 404. The cache control memory 410 may be configured to read data of each data block 404 individually (i.e. in data block size). The cache control memory 410 may be configured to determine if the data of the data block 404 is written in a cache block 408 of the cache 406. The cache control memory 410 may be configured to determine the cache block address of the cache block 408 in which the data of the data block 404 is written and read the data from the cache 406 if it is determined that the data of the data block 404 is stored in the cache block 408 of the cache 406. The cache control memory 410 may be configured to read the data of the data block 404 from the data storage medium 402 if it is determined that the data of the data block 404 is not stored in the cache block 408 of the cache 406.

Figure 8:
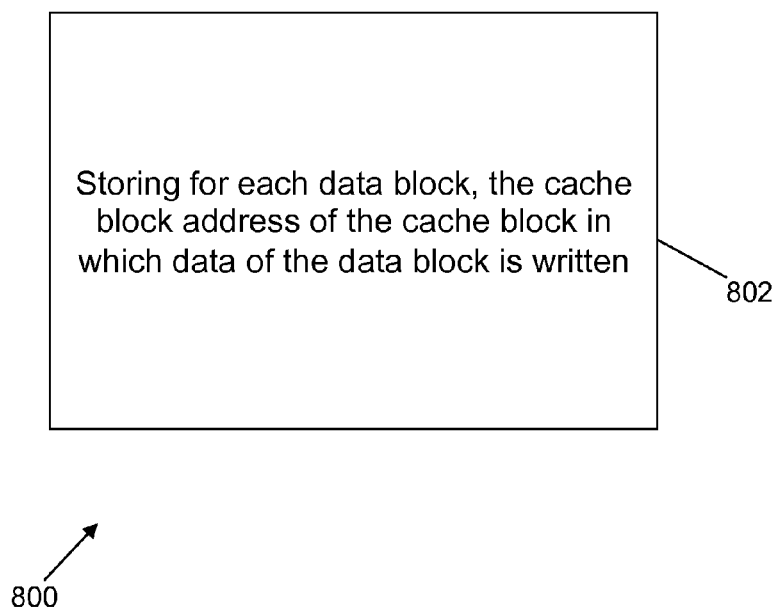
FIG. 8 shows a flowchart of a method of managing a cache in a data storage device according to one embodiment.

FIG. 8 shows a flowchart 800 of a method of managing a cache in a data storage device. The data storage device may include a data storage medium having a plurality of data blocks. The cache may have a plurality of cache blocks and each cache block may be identified by a cache block address. At 802, the cache block address of the cache block in which data of the data block is written may be stored for each data block.

In one embodiment, the method may include storing for each data block, the status of the cache block in which data of the data block is written. The method may include storing the cache block address and the status of the cache block in the cache. The cache block address and the status of each cache block may be stored in a metadata table. The metadata table may be stored in the cache.

In one embodiment, the method may include storing the status of the plurality of cache blocks. The method may include storing the status of the plurality of cache blocks in a memory cell or in the cache. The status of the plurality of cache blocks may be stored in a bitmap. The bitmap may be stored in the memory cell (e.g. DRAM) or in the cache.

Figure 9:
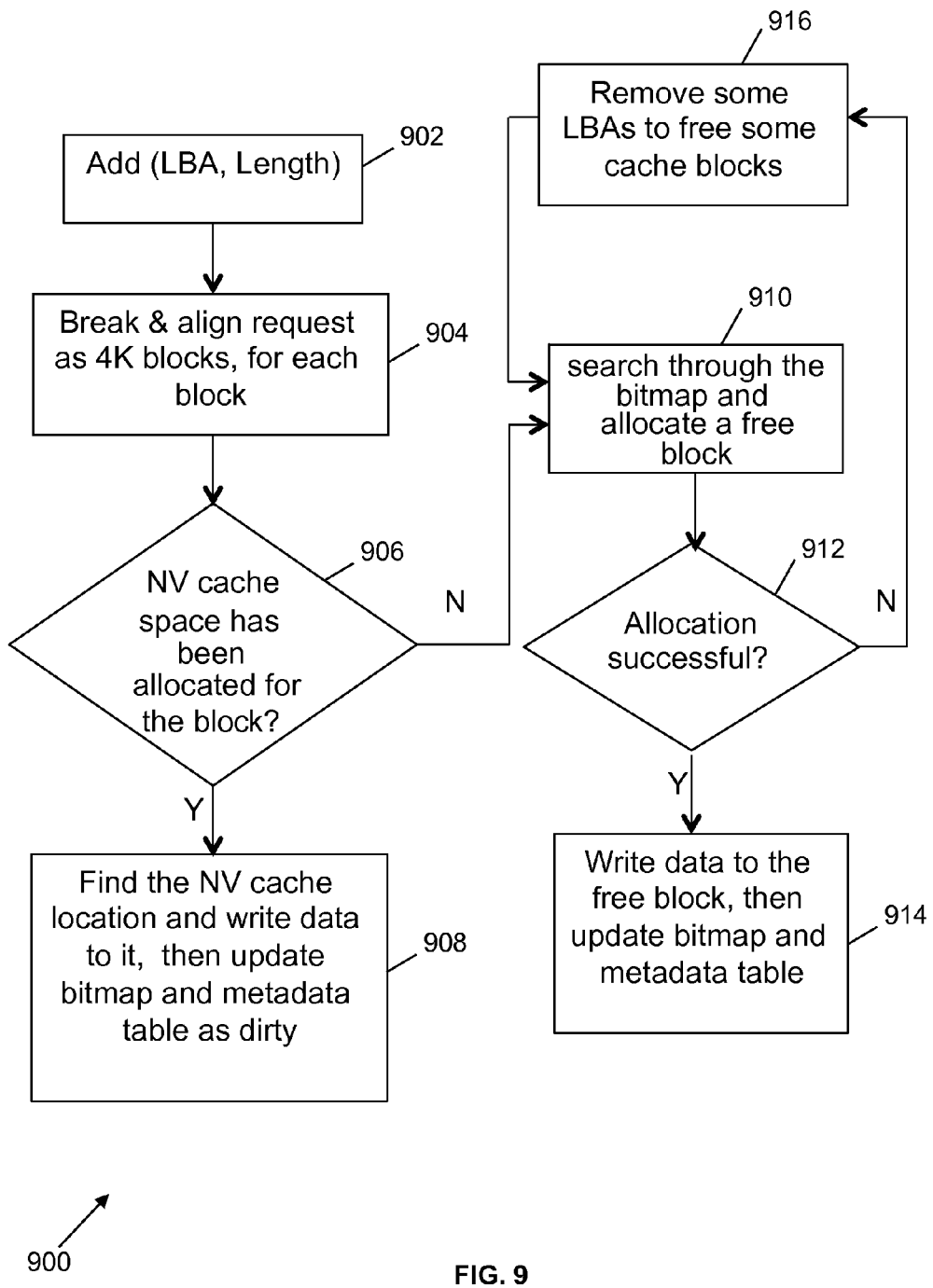
FIG. 9 shows a flowchart of adding addresses of data blocks in the cache pinned set and writing data of data blocks to the cache of a data storage device according to one embodiment.

FIG. 9 shows a flowchart 900 of writing data of data blocks (e.g. adding LBAs) in a cache. The flowchart 900 shows adding addresses of data blocks in a cache pinned set (e.g. NV Cache Pinned Set) and writing data of data blocks to the cache of a data storage device. At 902, an "Add LBAs" request may be received. Other similar requests/commands may be received. The ADD command or other NV cache commands which are still in the stage of drafting is a command for a host operating system to instruct the data storage device 400 to cache data. In other words, the ADD command is a cache command for hybrid drives with embedded NV cache. At 904, the request may be broken down into individual data block sizes. Data of each data block may be written in the cache individually. The LBA of each data block may be added in the cache individually. At 906, it is determined if a cache block is allocated for the data block.

At 908, the data of the data block is written in the allocated cache block and the status of the cache block is updated if it is determined that a cache block is allocated for the data block. The cache block address of the allocated cache block may be determined before the data of the data block is written in the allocated cache block. The status of the allocated cache block may be updated as "dirty" in the metadata table and the bitmap after the data of the data block is written in the allocated cache block. The LBA of the data block may be added in the NV Cache Pinned Set. The data of the data block 404 may be cached in the cache. At 910, if it is determined that a cache block is not allocated for the data block, a search through a bitmap is carried out to search for a free cache block and the free cache block found is allocated to the data block. At 912, it is determined if the allocation of the free cache block to the data block is successful.

At 914, the data of the data block is written in the allocated cache block and the status of the cache block is updated if it is determined that the allocation of the free cache block to the data block is successful. The LBA of the data block may be added in the NV Cache Pinned Set. The data of the data block 404 may be cached in the cache. At 916, if it is determined that the allocation of the free cache block to the data block is unsuccessful, some data 30 (e.g. LBAs) in the cache is removed to free some cache blocks. The flowchart 900 returns to 910 to search through the bitmap for a free cache block and allocate the free cache block found to the data block. The flowchart 900 proceeds to 912 to determine if the allocation of the free cache block to the data block is successful.

The flowchart 900 may repeat 916, 910 and 912 until a free cache block is successfully allocated to the data block.

Figure 10:
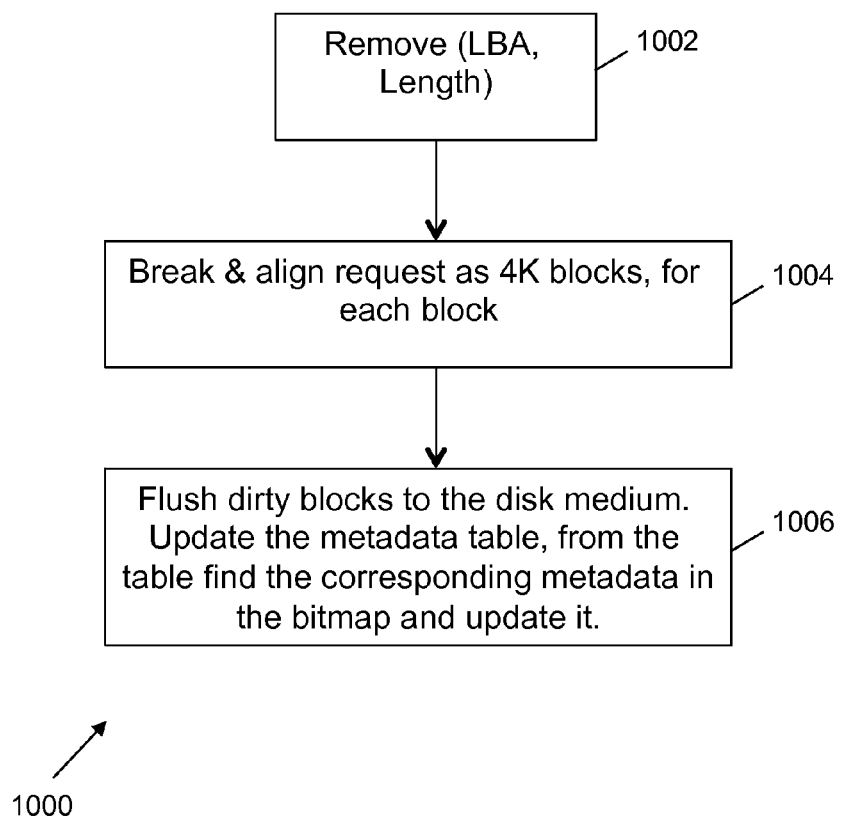
FIG. 10 shows a flowchart of removing addresses of data blocks from the cache pinned set and flushing data of dirty data blocks from the cache to the data storage device according to one embodiment.

FIG. 10 shows a flowchart 1000 of removing data (e.g. removing LBAs) from a cache. The flowchart 1000 shows removing addresses of data blocks from a cache pinned set (e.g. NV Cache Pinned Set) and flushing data of dirty blocks from the cache to a data storage device. At 1002, a "Remove LBAs" request may be received. Other similar requests/commands may be received. At 1004, the request may be broken down into individual data block sizes. Data of each data block may be removed from the cache individually. The LBA of each data block may be removed from the cache individually. At 1006, data of the data block may be removed from the corresponding cache block, the metastable may be updated, and the status of the cache block may be updated in the metastable and the bitmap. Data of dirty data blocks may be flushed from the cache to the data storage device (e.g. a data storage medium of the data storage device). The LBA of the data block may be removed from the NV Cache Pinned Set. The data block 404 may no longer be cached in the cache.

In one embodiment, the flowchart 1000 may illustrate the process 916 of the flowchart 900 of FIG. 900.

Figure 11:
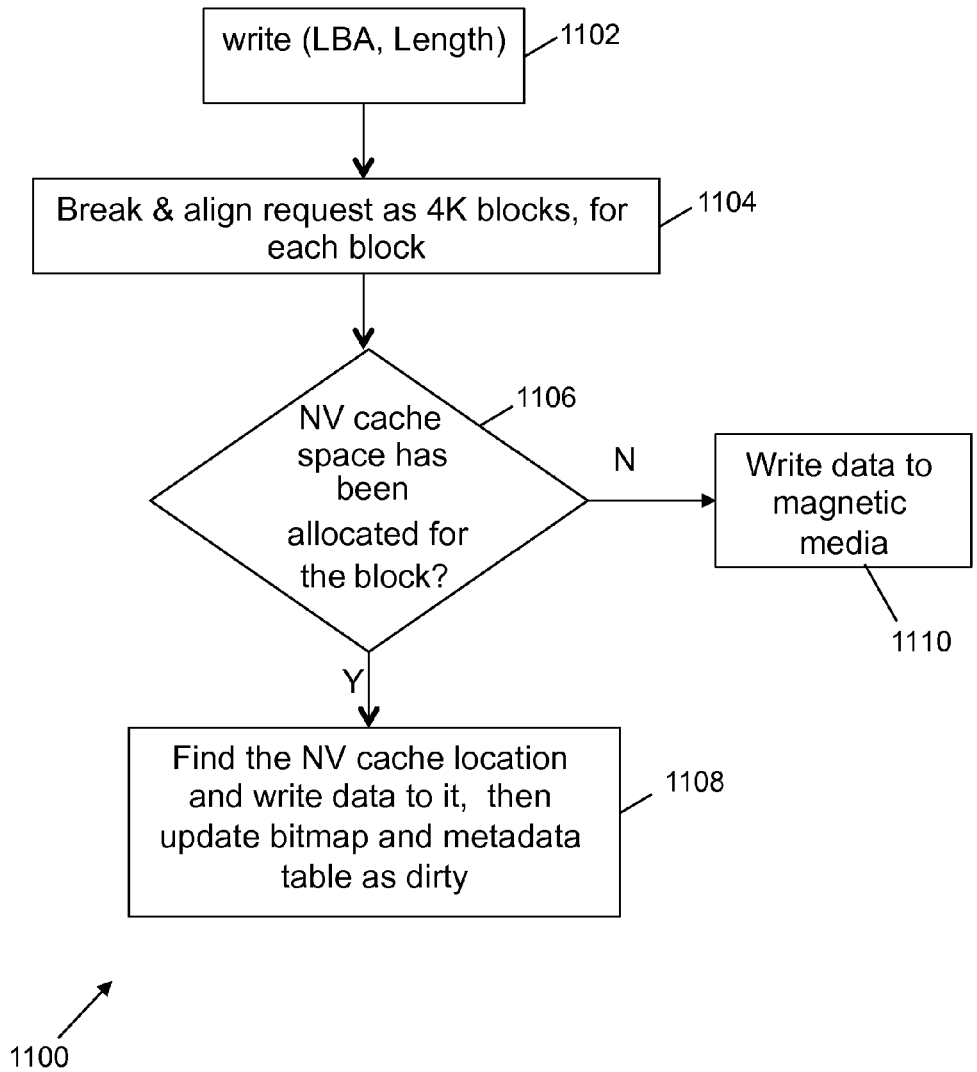
FIG. 11 shows a flowchart of writing data of data blocks in a cache of a data storage device according to one embodiment.

FIG. 11 shows a flowchart 1100 of writing data (e.g. LBAs) of data blocks in a cache. At 1102, a "Write data" request may be received. The Write command is a standard command for a host operating system to instruct a data storage device to write data on a disk LBA. It is a standard command for all kinds of disk drives. At 1104, the request may be broken down into individual data block sizes. Data of each data block may be written in the cache individually. At 1106, it is determined if a cache block is allocated for the data block.

At 1108, the data of the data block is written in the allocated cache block and the status of the cache block is updated if it is determined that a cache block is allocated for the data block. The cache block address of the allocated cache block may be determined before the data of the data block is written in the allocated cache block. The status of the allocated cache block may be updated as "dirty" in the metadata table and the bitmap after the data of the data block is written in the allocated cache block. At 1110, if it is determined that a cache block is not allocated for the data block, the data of the data block may be written in a data storage medium. In other words, the LBA of the data block is not cached.

The flowchart 1100 in FIG. 11 illustrates that if the data block written by a host operating system has been cached in the cache (e.g. LBA of a data block is in the NV Cache Pinned Set), the data of the data block is written to the cache. Otherwise, it is written to the data storage medium.

The processes 1106 and 1108 correspond to the processes 906 and 908 of the flowchart 900 of FIG. 9. The process 1110 may be used as an option for the determining process 906 of the flowchart 900 of FIG. 9.

In one embodiment, the data of the data block may be written in a data storage medium if no cache block can be successfully allocated for the data block. The process 1110 may be used as an option for the determining process 912 of the flowchart 900 of FIG. 9.

Figure 12:
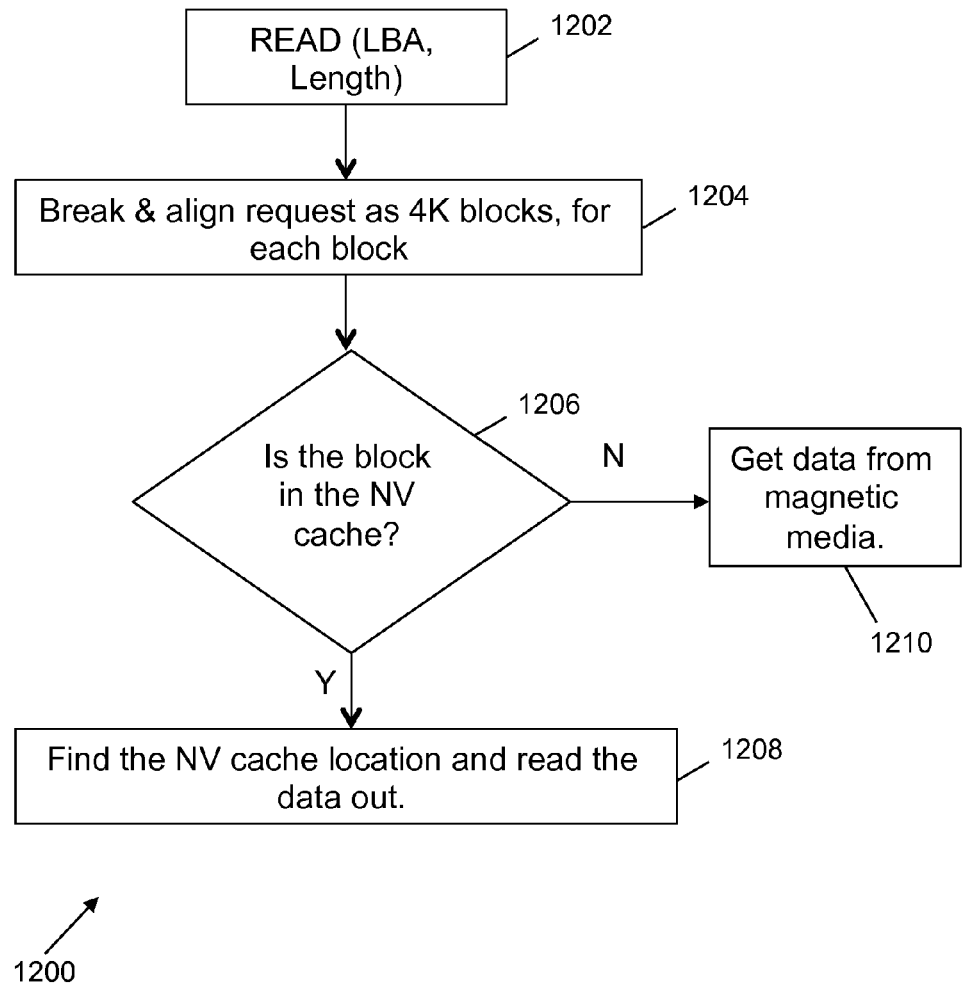
FIG. 12 shows a flowchart of reading data of data blocks according to one embodiment.

FIG. 12 shows a flowchart 1200 of reading data. At 1202, a "Read data" request may be received. At 1204, the request may be broken down into individual data block sizes. Data of each data block may be read individually. At 1206, it is determined if the data of the data block is written in the cache (e.g. a cache block of the cache). At 1208, the cache block address of the cache block in which the data of the data block is written is determined and the data is read from the cache if it is determined that the data of the data block is stored in the cache (e.g. a cache block of the cache). At 1210, the data of the data block is read from a data storage medium if it is determined that the data of the data block is not stored in the cache (e.g. a cache block of the cache).

In one embodiment, the above described data storage device and the above described method record the cache block address (CBA) of a cache block of a cache for each data block of a data storage medium (e.g. hard disk). The cache block contains the same data as the corresponding data block. The status of the cache block for each data block is also recorded. The cache block address and the status of the cache block for each data block are recorded as a row entry in a table (e.g. metadata table). Each row entry corresponds to a respective data block (e.g. block address of the data block). Thus, the cache block address of the corresponding cache block can be easily found by pointing to the row entry belonging to the data block. The above described data storage device and the above described method also record the status of all the cache blocks of the cache e.g. in a bitmap table. The status of each cache block can be determined with ease by searching the bitmap table.

The above described data storage device and the above described method use a one-to-one mapping scheme between the metadata table entries and the LBAs of the data blocks. Such an approach can directly locate a table entry for a LBA, avoiding any searching or computation which is required by the conventional set associative hash approach.

The above described data storage device and the above described method can stores the metadata table on the cache, and a small-sized bitmap in the DRAM or the cache to keep the status of the cache blocks for quick reference. However, the conventional set associative hash approach cannot store its metadata table on the cache. Otherwise, the cache will be accessed too many times and the performance will degrade significantly. Further, the conventional set associative hash approach consumes too much DRAM which makes it impractical for actual usage. The above described data storage device and the above described method consume much lesser DRAM space, making it more suitable for hybrid disks. The above described data storage device and the above described method are also more economical and energy efficient.

Various embodiments described herein for the data storage device 400 also apply analogously for a method of managing a cache in a data storage device.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

What is claimed is:

1. A data storage device, comprising:
   a data storage medium including a total number of data blocks;
   a cache including a plurality of cache blocks, wherein each cache block has a corresponding cache block address;
   a metadata table including table entries corresponding to the data blocks, respectively, wherein each of the table entries is configured to store the cache block address of one of the cache blocks in which data of the corresponding one of the data blocks is written; and
   a bitmap configured to store statuses of all of the cache blocks, respectively.

2. The data storage device of claim 1 further comprising cache control memory that, for storing data from one data block into the cache, (i) identifies a free one of the cache blocks from the bitmap, (ii) stores the cache block address of the free one of the cache blocks in the corresponding table entry of the metadata table, (iii) stores the data of the one data block into the free one of the cache blocks, and (iv) updates the status of the free one of the cache blocks in the bitmap.

3. The data storage device of claim 1, wherein the statuses are each selected from a group comprising dirty, free and clean.

4. The data storage device of claim 1, wherein (i) a first one of the table entries corresponds to a first one of the data blocks, (ii) a second one of the table entries corresponds to a second one of the data blocks, . . . , and (m) a last one of the table entries corresponds to a last one of the data blocks.

5. The data storage device of claim 1, wherein (i) a first one of the table entries corresponds to a last one of the data blocks, (ii) a second one of the table entries corresponds to a second to last one of the data blocks, . . . , and (m) a last one of the table entries corresponds to a first one of the data blocks.

6. The data storage device of claim 1, wherein the metadata table is stored in the cache.

7. The data storage device of claim 1, wherein the bitmap is stored in the cache.

8. The data storage device of claim 1, wherein the bitmap is stored in dynamic random access memory (DRAM).

9. The data storage device of claim 1, wherein each of the statuses occupies two bits of the bitmap.

10. The data storage device of claim 1, wherein the cache is a non-volatile (NV) cache.

11. The data storage device of claim 1, wherein the data storage device is a hybrid disk.

12. A method for managing storage of a data storage device, the method comprising:
- receiving a request to cache data written in one of a total of M data blocks of a data storage medium, wherein M is an integer greater than 1; and
- in response to the request to cache the data written in the one of M data blocks of the data storage medium:
  - (a) writing the data from the one of the M data blocks to one of N cache blocks of a cache, the N cache blocks having N cache block addresses, respectively, wherein N is an integer greater than 1;
  - (b) writing, in one of M table entries of a metadata table corresponding to the one of the M data blocks, the one of the N cache block addresses of the one of the N cache blocks; and
  - (c) updating a status of the one of the N cache block addresses in a bitmap, the bitmap configured to store N statuses for the N cache blocks, respectively.

13. The method of claim 12 further comprising, in response to the request to cache the data written in the one of M data blocks, determines that the one of the N cache blocks is free based on the status of the one of the N cache blocks in the bitmap.

14. The method of claim 12, wherein the N statuses are each selected from a group comprising dirty, free and clean.

15. The method of claim 12, wherein the metadata table is stored in the cache.

16. The method of claim 12, wherein the bitmap is stored in the cache.

17. The method of claim 12, wherein the bitmap is stored in dynamic random access memory (DRAM).

18. The method of claim 12, wherein updating the status of the one of the N cache block addresses in the bitmap includes storing two bits indicative of the status in the bitmap.

19. The method of claim 12, wherein each of the N statuses occupies two bits of the bitmap.

20. The method of claim 12, wherein the data storage device is a hybrid disk.

* * * * *